United States Patent
Yang et al.

(10) Patent No.: US 7,039,381 B2
(45) Date of Patent: May 2, 2006

(54) ON-CHIP DIFFERENTIAL INDUCTOR AND APPLICATIONS THEREOF

(75) Inventors: Hung Yu Yang, Los Angeles, CA (US); Jesus A. Castaneda, Marina Del Ray, CA (US); Lijun Zhang, Los Angeles, CA (US)

(73) Assignee: Broadcom Corporation, Irvine, CA (US)

( * ) Notice: Subject to any disclaimer, the term of this patent is extended or adjusted under 35 U.S.C. 154(b) by 615 days.

(21) Appl. No.: 10/200,802

(22) Filed: Jul. 23, 2002

(65) Prior Publication Data

US 2004/0018823 A1    Jan. 29, 2004

(51) Int. Cl.
*H04B 1/18* (2006.01)
(52) U.S. Cl. .................... 455/292; 455/296; 336/200
(58) Field of Classification Search ............. 455/292, 455/296; 336/200, 232; 257/531
See application file for complete search history.

(56) References Cited

U.S. PATENT DOCUMENTS 6,476,704 B1 * 11/2002 Goff ..................... 336/200
6,707,367 B1 * 3/2004 Castaneda et al. ......... 336/200
6,885,275 B1 * 4/2005 Chang .................... 336/200

OTHER PUBLICATIONS

Danesh, "A Q-Factor enhancement technique for MMIC inductors", IEEE MTT-S Digest, pp. 183-186, Jun. 1998.
Behzad Razavi, "RF Microelectronics", Prentice Hall Communications Engineering and Emerging Technologies Series, Theodore S. Rappaport, Series Editor 1998, A Simon & Schuster Company, Upper Saddle River, NJ 07458.

* cited by examiner

*Primary Examiner*—Nay Maung
*Assistant Examiner*—Philip J. Sobutka
(74) *Attorney, Agent, or Firm*—Garlick Harrison & Markison LLP; Timothy W. Markison

(57) ABSTRACT

An on-chip differential inductor includes a $1^{st}$ interwound winding having a substantially octagonal shape, or rectangular octagonal shape, and a $2^{nd}$ interwound winding having a substantially octagonal shape, or rectangular octagonal shape, that is interwound with the $1^{st}$ interwound winding. Both the $1^{st}$ and $2^{nd}$ interwound windings are on the same layer of the integrated circuit. Each interwound winding includes two nodes; one of node of each winding is commonly coupled to a reference potential. The other node of each winding is operably coupled to receive a respective leg of a differential signal.

38 Claims, 7 Drawing Sheets

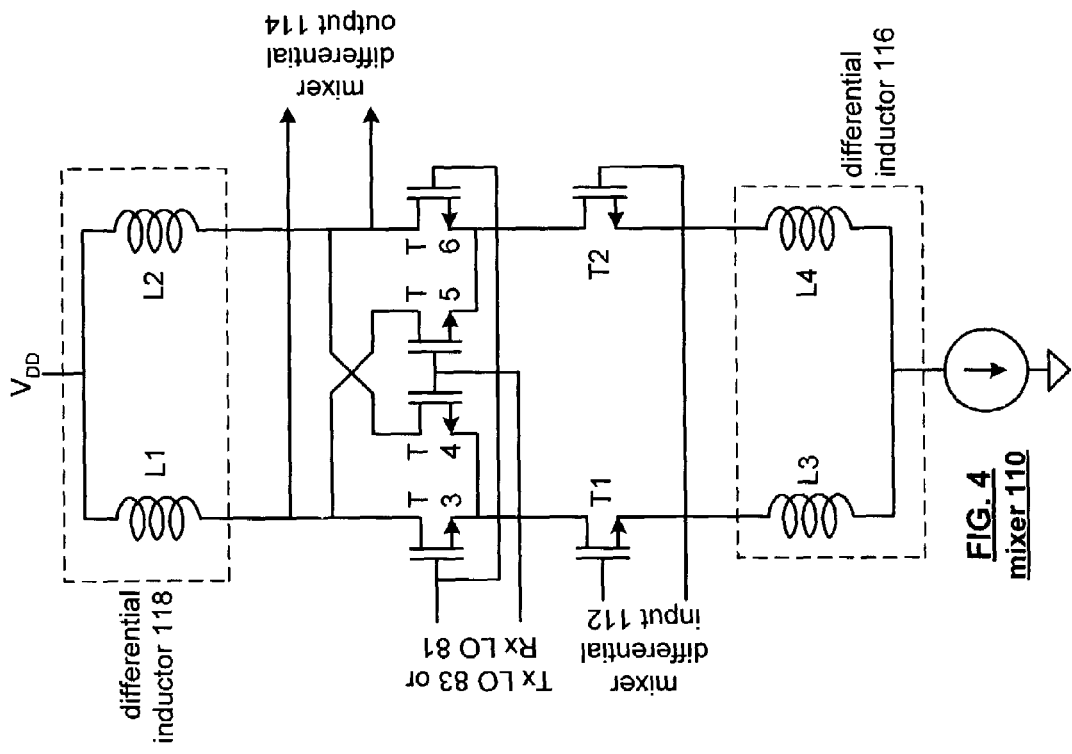
FIG. 4 mixer 110
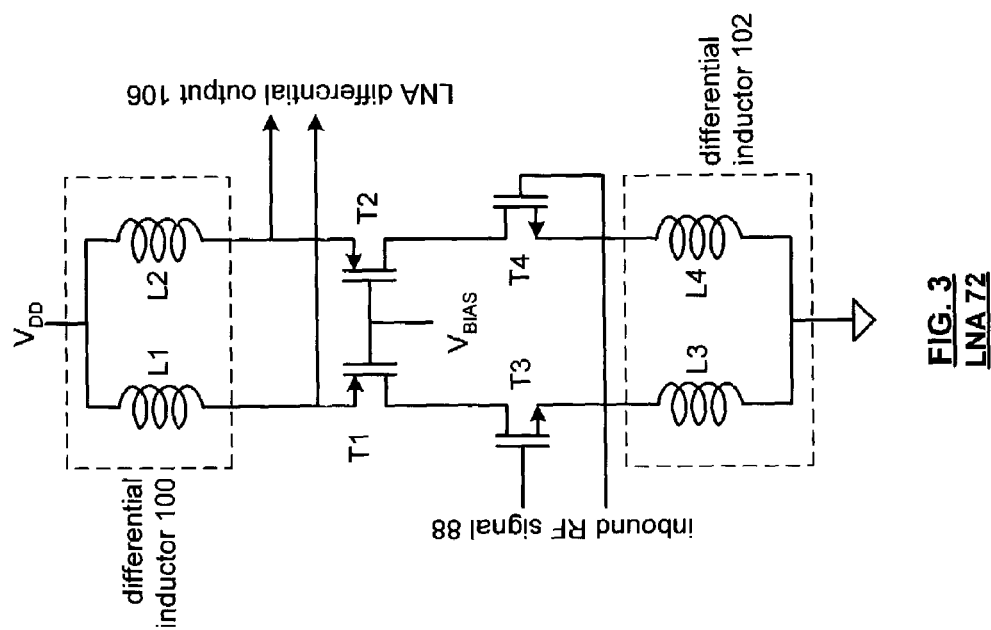
FIG. 3 LNA 72

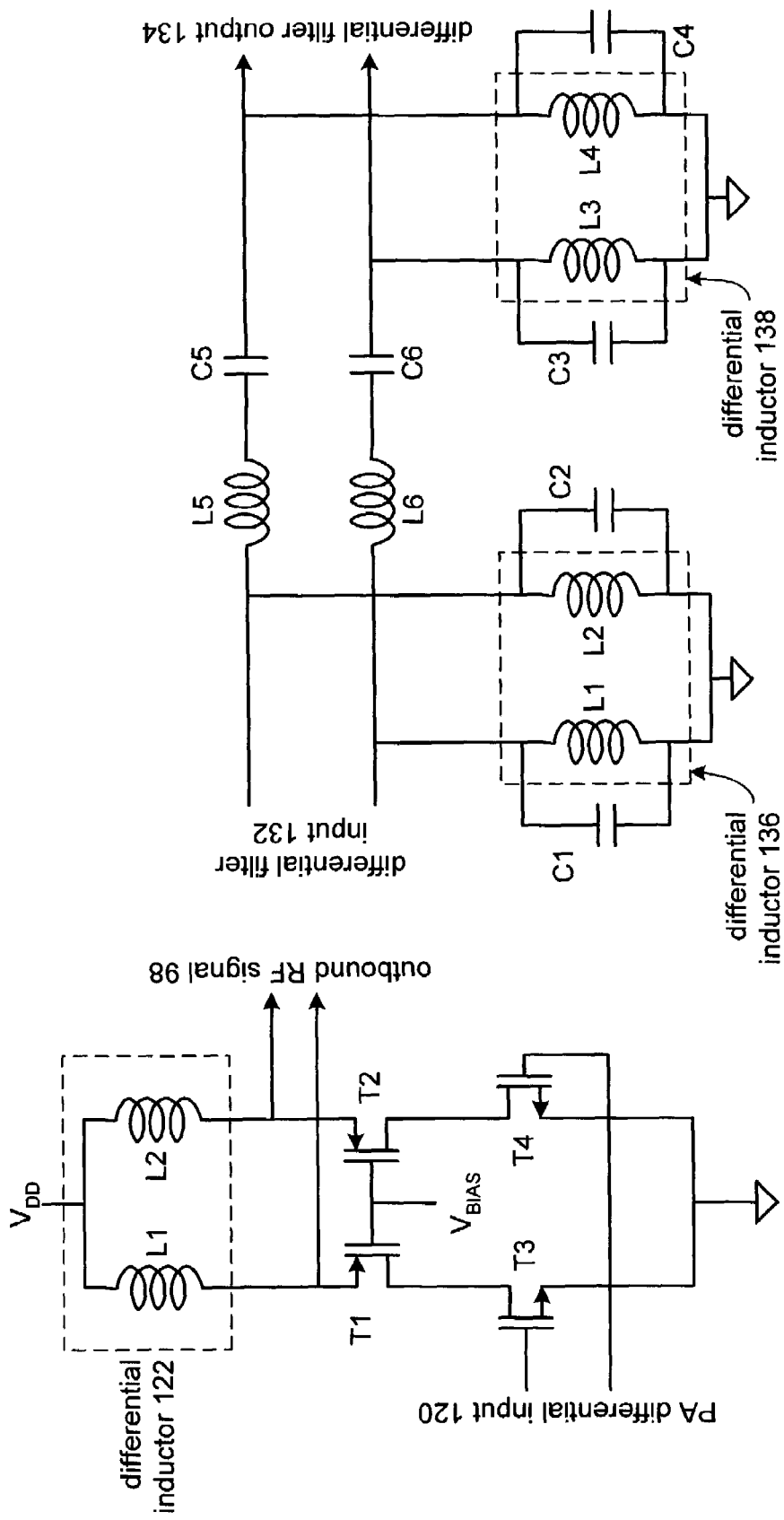

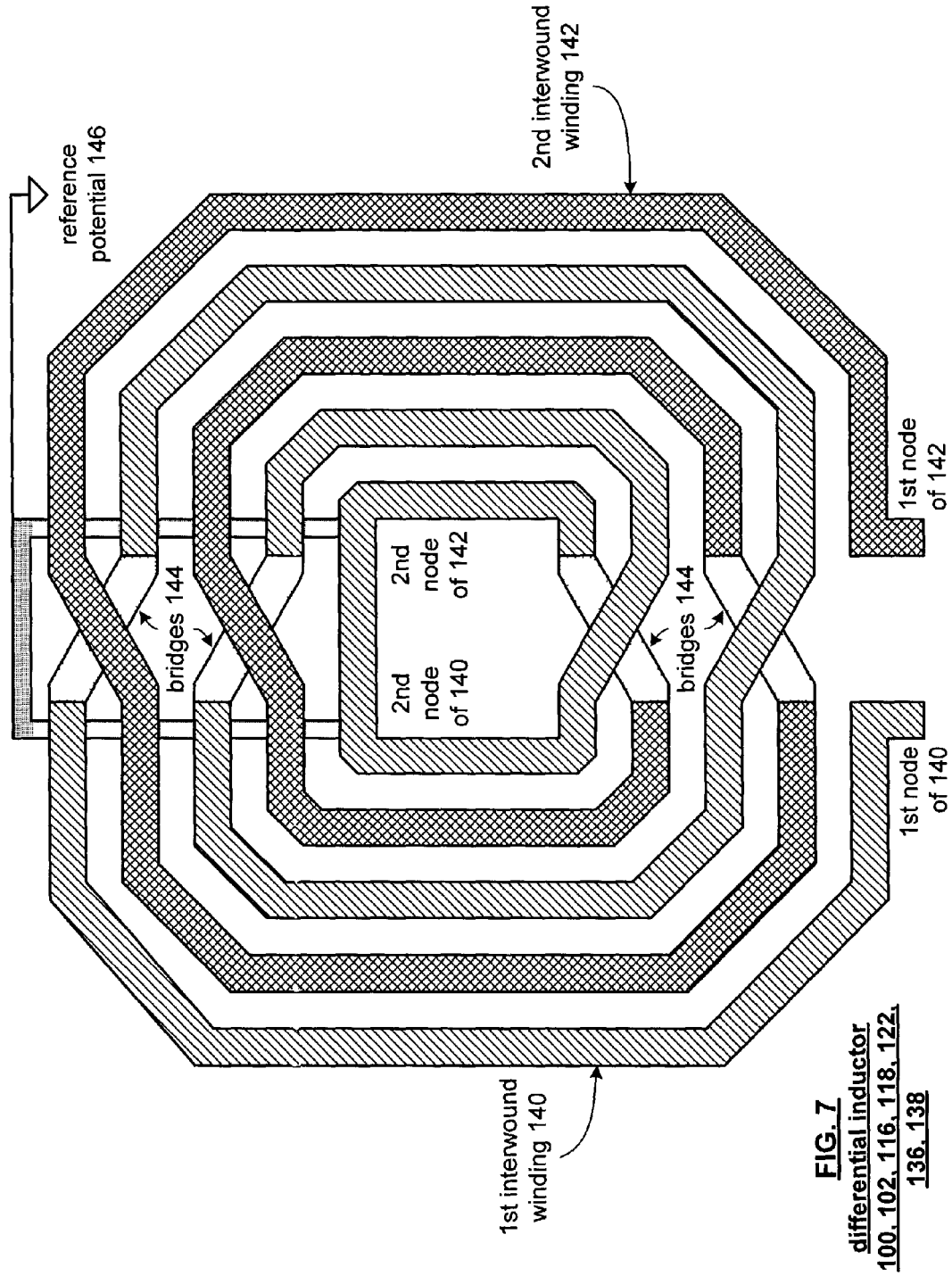

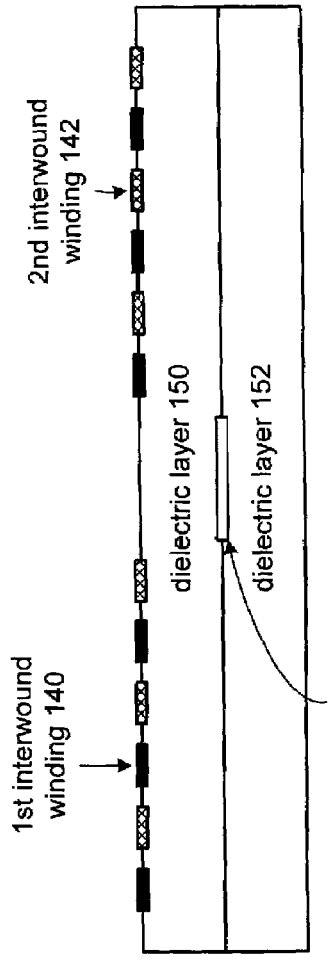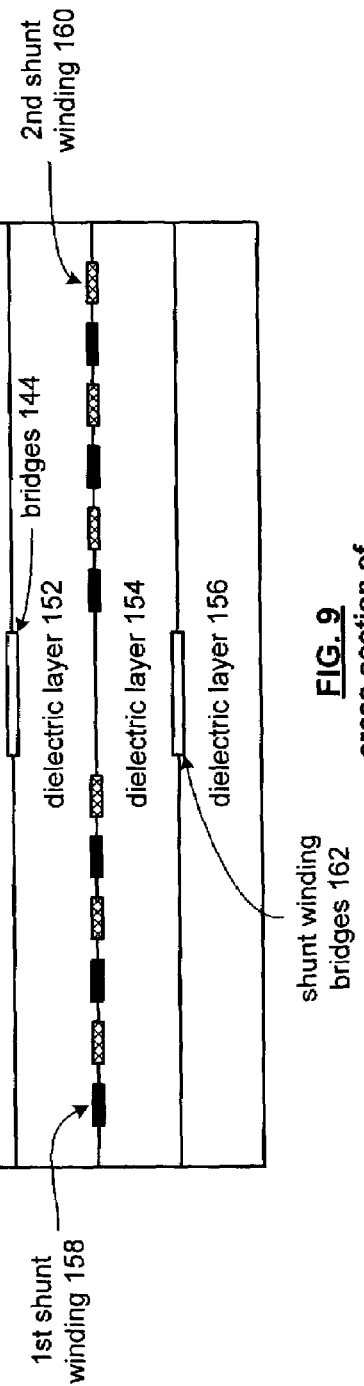

differential inductor
100, 102, 116, 118, 122, 136, 138

ON-CHIP DIFFERENTIAL INDUCTOR AND APPLICATIONS THEREOF

BACKGROUND OF THE INVENTION

1. Technical Field of the Invention

This invention relates generally to radio frequency integrated circuits and more particularly to on-chip differential inductors used in such radio frequency integrated circuits.

2. Description of Related Art

Communication systems are known to support wireless and wire lined communications between wireless and/or wire lined communication devices. Such communication systems range from national and/or international cellular telephone systems to the Internet to point-to-point in-home wireless networks. Each type of communication system is constructed, and hence operates, in accordance with one or more communication standards. For instance, wireless communication systems may operate in accordance with one or more standards including, but not limited to, IEEE 802.11, Bluetooth, advanced mobile phone services (AMPS), digital AMPS, global system for mobile communications (GSM), code division multiple access (CDMA), local multi-point distribution systems (LMDS), multi-channel-multi-point distribution systems (MMDS), and/or variations thereof.

Depending on the type of wireless communication system, a wireless communication device, such as a cellular telephone, two-way radio, personal digital assistant (PDA), personal computer (PC), laptop computer, home entertainment equipment, et cetera communicates directly or indirectly with other wireless communication devices. For direct communications (also known as point-to-point communications), the participating wireless communication devices tune their receivers and transmitters to the same channel or channels (e.g., one of the plurality of radio frequency (RF) carriers of the wireless communication system) and communicate over that channel(s). For indirect wireless communications, each wireless communication device communicates directly with an associated base station (e.g., for cellular services) and/or an associated access point (e.g., for an in-home or in-building wireless network) via an assigned channel. To complete a communication connection between the wireless communication devices, the associated base stations and/or associated access points communicate with each other directly, via a system controller, via the public switch telephone network, via the Internet, and/or via some other wide area network.

For each wireless communication device to participate in wireless communications, it includes a built-in radio transceiver (i.e., receiver and transmitter) or is coupled to an associated radio transceiver (e.g., a station for in-home and/or in-building wireless communication networks, RF modem, etc.). As is known, the transmitter includes a data modulation stage, one or more intermediate frequency stages, and a power amplifier. The data modulation stage converts raw data into baseband signals in accordance with the particular wireless communication standard. The one or more intermediate frequency stages mix the baseband signals with one or more local oscillations to produce RF signals. The power amplifier amplifies the RF signals prior to transmission via an antenna.

As is also known, the receiver is coupled to the antenna and includes a low noise amplifier, one or more intermediate frequency stages, a filtering stage, and a data recovery stage. The low noise amplifier receives inbound RF signals via the antenna and amplifies them. The one or more intermediate frequency stages mix the amplified RF signal with one or more local oscillations to convert the amplified RF signals into baseband signals or an intermediate frequency (IF) signals. The filtering stage filters the baseband signals or the IF signals to attenuate unwanted out of band signals to produce filtered signals. The data recovery stage recovers raw data from the filtered signals in accordance with the particular wireless communication standard.

Many of the components in the radio receiver and radio transmitter include inductors. For example, mixers in the IF stages of both the receiver and transmitter, the power amplifier, a voltage control oscillator of a local oscillation module, the low noise amplifier, and the filters each include one or more inductors. When the radio receiver and/or radio transmitter are implemented as integrated circuits, the fabrication of on-chip inductors for components used within the receiver and/or transmitter is an important design consideration. Currently, the state of the art of on-chip inductor design in a CMOS process provides one with few practical design choices. For instance, one could choose a spiral wound single ended inductor (square or octagon in shape), which provides up to approximately 20 nano Henries. The inductance value is limited due to the capacitance of the inductor, which, in combination with the inductance, establishes the self-resonating frequency.

For differential applications, one could choose a pair of single ended inductors or a spiral wound square differential inductor. Typically, the spiral wound square differential inductor is preferred over a pair of single ended inductors because it is smaller in size and has a higher quality factor (Q).

While the current state of the art of on-chip inductors provides practical design choices, they are insufficient for optimal integrated circuit design, especially for radio frequency integrated circuits (RFIC). For example, the spiral wound square differential inductor in many IC designs is not an optimal shape for efficient IC layout. Further, increasing the quality factor of an on-chip inductor is beneficial in many applications.

Therefore, a need exists for an on-chip differential inductor that has an improved quality factor and may be shaped for optimal integrated circuit (IC) layout.

BRIEF SUMMARY OF THE INVENTION

The on-chip differential inductor and applications thereof of the present invention substantially meet these needs and others. One embodiment of an on-chip differential inductor includes a $1^{st}$ interwound winding having a substantially octagonal shape and a $2^{nd}$ interwound winding having a substantially octagonal shape that is interwound with the $1^{st}$ interwound winding. Both the $1^{st}$ and $2^{nd}$ interwound windings are on the same layer of the integrated circuit. Each interwound winding includes two nodes; one of node of each winding is commonly coupled to a reference potential. The other node of each winding is operably coupled to receive a respective leg of a differential signal. In this configuration, the $1^{st}$ and $2^{nd}$ windings are symmetrical and have a more optimal integrated circuit layout than the spiral square differential inductor of the prior art. In addition, the quality factor of the present on-chip inductor is increased by fabricating the $1^{st}$ and $2^{nd}$ interwound windings on a metalization layer of the integrated circuit having the lowest resistivity, which is typically the top layer.

Another embodiment of an on-chip differential inductor in accordance with the present invention includes a $1^{st}$ and $2^{nd}$ interwound windings on the same layer of an integrated circuit. The $1s^t$ and $2^{nd}$ interwound windings each include two nodes, one of the nodes of each winding is commonly together. The other node of each winding is coupled to receive respective legs of a differential signal. The $2^{nd}$ winding is interwound with the $1^{st}$ winding and both windings are symmetrical to each other. The $1^{st}$ and $2^{nd}$ interwound windings are rectangular octagonal in shape having a $1^{st}$ dimension lengthened with respect to a square octagonal reference shape and having a $2^{nd}$ dimension shortened with respect to the square octagonal reference shape. The area of the rectangular octagonal shape is similar to the area of a square octagonal reference shape. By altering the geometric configuration in this manner, this embodiment of an on-chip differential inductor is more readily placeable in an IC layout to minimize the die area for corresponding integrated circuits.

The various embodiments of an on-chip differential inductor that may be fabricated in accordance with the teachings of the present invention may be used in any one of a number of components that comprise an integrated radio circuit. For instance, the on-chip differential inductor in accordance with the present invention may be used in a low noise amplifier, a mixer, a filter, a local oscillator, and/or a power amplifier of an integrated circuit radio. By utilizing such an inventive on-chip differential inductor in radio frequency integrated circuit (RFIC) components, the performance of RFIC components is enhanced and the integrated circuit die area is reduced.

BRIEF DESCRIPTION OF THE SEVERAL VIEWS OF THE DRAWINGS

FIG. 3 is a schematic block diagram of a low noise amplifier that includes differential inductors in accordance with the present invention;

FIG. 4 is a schematic block diagram of a mixer that includes differential inductors in accordance with the present invention;

FIG. 5 is a schematic block diagram of a power amplifier that includes a differential inductor in accordance with the present invention;

FIG. 6 is a schematic block diagram of a bandpass filter that includes differential inductors in accordance with the present invention;

FIG. 7 is a graphical representation of a differential inductor in accordance with the present invention;

FIG. 8 is a cross sectional view of a single layer differential inductor in accordance with the present invention;

FIG. 9 is a cross sectional view of a shunted differential inductor in accordance with the present invention.

DETAILED DESCRIPTION OF THE INVENTION

Figure 1:
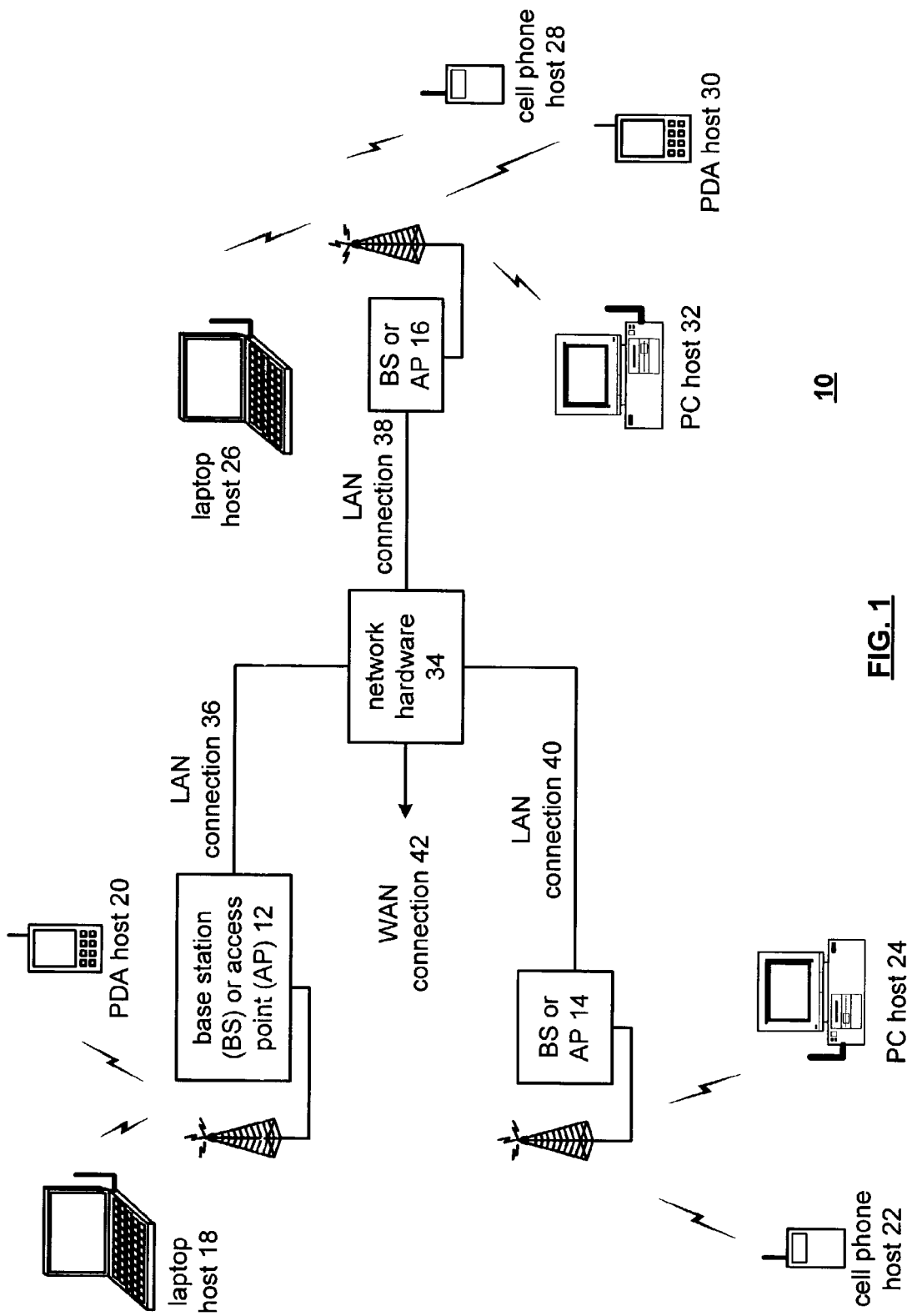
FIG. 1 is a schematic block diagram of a wireless communication system in accordance with the present invention.

FIG. 1 is a schematic block diagram illustrating a communication system 10 that includes a plurality of base stations and/or access points 12–16, a plurality of wireless communication devices 18–32 and a network hardware component 34. The wireless communication devices 18–32 may be laptop host computers 18 and 26, personal digital assistant hosts 20 and 30, personal computer hosts 24 and 32 and/or cellular telephone hosts 22 and 28. The details of the wireless communication devices will be described in greater detail with reference to FIG. 2.

The base stations or access points 12–16 are operably coupled to the network hardware 34 via local area network connections 36, 38 and 40. The network hardware 34, which may be a router, switch, bridge, modem, system controller, et cetera provides a wide area network connection 42 for the communication system 10. Each of the base stations or access points 12–16 has an associated antenna or antenna array to communicate with the wireless communication devices in its area. Typically, the wireless communication devices register with a particular base station or access point 12–14 to receive services from the communication system 10. For direct connections (i.e., point-to-point communications), wireless communication devices communicate directly via an allocated channel.

Typically, base stations are used for cellular telephone systems and like-type systems, while access points are used for in-home or in-building wireless networks. Regardless of the particular type of communication system, each wireless communication device includes a built-in radio and/or is coupled to a radio. The radio includes a highly linear amplifier and/or programmable multi-stage amplifier as disclosed herein to enhance performance, reduce costs, reduce size, and/or enhance broadband applications.

Figure 2:
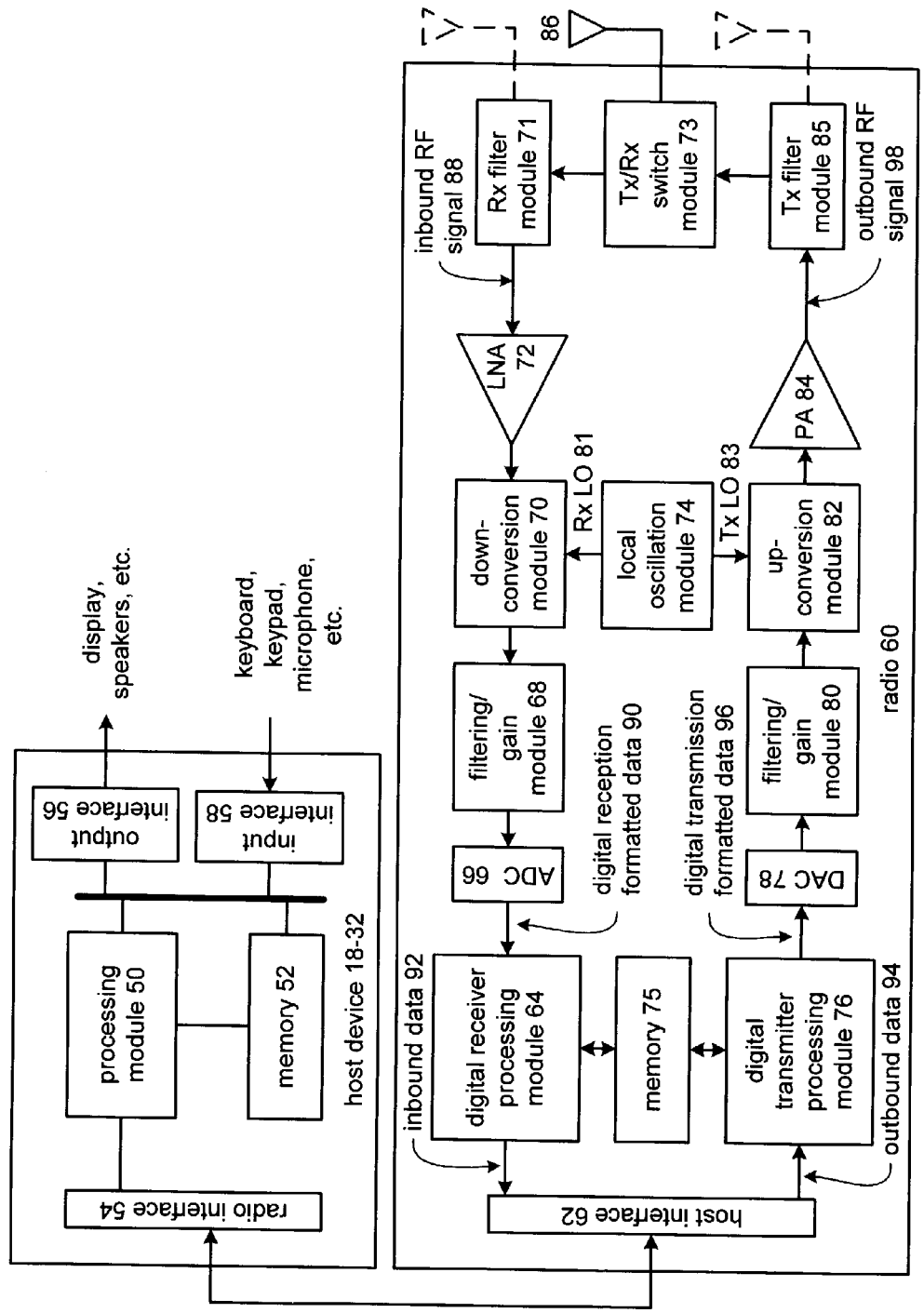
FIG. 2 is a schematic block diagram of a wireless communication device in accordance with the present invention.

FIG. 2 is a schematic block diagram illustrating a wireless communication device that includes the host device 18–32 and an associated radio 60. For cellular telephone hosts, the radio 60 is a built-in component. For personal digital assistants hosts, laptop hosts, and/or personal computer hosts, the radio 60 may be built-in or an externally coupled component.

As illustrated, the host device 18–32 includes a processing module 50, memory 52, radio interface 54, input interface 58 and output interface 56. The processing module 50 and memory 52 execute the corresponding instructions that are typically done by the host device. For example, for a cellular telephone host device, the processing module 50 performs the corresponding communication functions in accordance with a particular cellular telephone standard.

The radio interface 54 allows data to be received from and sent to the radio 60. For data received from the radio 60 (e.g., inbound data), the radio interface 54 provides the data to the processing module 50 for further processing and/or routing to the output interface 56. The output interface 56 provides connectivity to an output display device such as a display, monitor, speakers, et cetera such that the received data may be displayed. The radio interface 54 also provides data from the processing module 50 to the radio 60. The processing module 50 may receive the outbound data from an input device such as a keyboard, keypad, microphone, et cetera via the input interface 58 or generate the data itself. For data received via the input interface 58, the processing module 50 may perform a corresponding host function on the data and/or route it to the radio 60 via the radio interface 54.

Radio 60 includes a host interface 62, digital receiver processing module 64, an analog-to-digital converter 66, a filtering/attenuation module 68, an IF mixing down conversion stage 70, a receiver filter 71, a low noise amplifier 72, a transmitter/receiver switch 73, a local oscillation module 74, memory 75, a digital transmitter processing module 76, a digital-to-analog converter 78, a filtering/gain module 80, an IF mixing up conversion stage 82, a power amplifier 84, a transmitter filter module 85, and an antenna 86. The antenna 86 may be a single antenna that is shared by the transmit and receive paths as regulated by the Tx/Rx switch 77, or may include separate antennas for the transmit path and receive path. The antenna implementation will depend on the particular standard to which the wireless communication device is compliant.

The digital receiver processing module 64 and the digital transmitter processing module 76, in combination with operational instructions stored in memory 75, execute digital receiver functions and digital transmitter functions, respectively. The digital receiver functions include, but are not limited to, digital intermediate frequency to baseband conversion, demodulation, constellation demapping, decoding, and/or descrambling. The digital transmitter functions include, but are not limited to, scrambling, encoding, constellation mapping, modulation, and/or digital baseband to IF conversion. The digital receiver and transmitter processing modules 64 and 76 may be implemented using a shared processing device, individual processing devices, or a plurality of processing devices. Such a processing device may be a microprocessor, micro-controller, digital signal processor, microcomputer, central processing unit, field programmable gate array, programmable logic device, state machine, logic circuitry, analog circuitry, digital circuitry, and/or any device that manipulates signals (analog and/or digital) based on operational instructions. The memory 75 may be a single memory device or a plurality of memory devices. Such a memory device may be a read-only memory, random access memory, volatile memory, non-volatile memory, static memory, dynamic memory, flash memory, and/or any device that stores digital information. Note that when the processing module 64 and/or 76 implements one or more of its functions via a state machine, analog circuitry, digital circuitry, and/or logic circuitry, the memory storing the corresponding operational instructions is embedded with the circuitry comprising the state machine, analog circuitry, digital circuitry, and/or logic circuitry.

In operation, the radio 60 receives outbound data 94 from the host device via the host interface 62. The host interface 62 routes the outbound data 94 to the digital transmitter processing module 76, which processes the outbound data 94 in accordance with a particular wireless communication standard (e.g., IEEE802.11a, IEEE802.11b, Bluetooth, et cetera) to produce digital transmission formatted data 96. The digital transmission formatted data 96 will be a digital base-band signal or a digital low IF signal, where the low IF typically will be in the frequency range of one hundred kilohertz to a few megahertz.

The digital-to-analog converter 78 converts the digital transmission formatted data 96 from the digital domain to the analog domain. The filtering/gain module 80, which may be implemented in accordance with the teachings of the present invention, filters and/or adjusts the gain of the analog signal prior to providing it to the IF mixing stage 82. The IF mixing stage 82, which may be implemented in accordance with the teachings of the present invention, directly converts the analog baseband or low IF signal into an RF signal based on a transmitter local oscillation 83 provided by local oscillation module 74. The power amplifier 84, which may be implemented in accordance with the teachings of the present invention, amplifies the RF signal to produce outbound RF signal 98, which is filtered by the transmitter filter module 85, which may be implemented in accordance with the teachings of the present invention. The antenna 86 transmits the outbound RF signal 98 to a targeted device such as a base station, an access point and/or another wireless communication device.

The radio 60 also receives an inbound RF signal 88 via the antenna 86, which was transmitted by a base station, an access point, or another wireless communication device. The antenna 86 provides the inbound RF signal 88 to the receiver filter module 71 via the Tx/Rx switch 77, where the Rx filter 71, which may be implemented in accordance with the teachings of the present invention, bandpass filters the inbound RF signal 88. The Rx filter 71 provides the filtered RF signal to low noise amplifier 72, which amplifies the signal 88 to produce an amplified inbound RF signal. The low noise amplifier 72, which may be implemented in accordance with the teachings of the present invention, provides the amplified inbound RF signal to the IF mixing module 70, which directly converts the amplified inbound RF signal into an inbound low IF signal or baseband signal based on a receiver local oscillation 81 provided by local oscillation module 74. The down conversion module 70, which may be implemented in accordance with the teachings of the present invention, provides the inbound low IF signal or baseband signal to the filtering/attenuation module 68. The filtering/attenuation module 68 may be implemented in accordance with the teachings of the present invention to filter and/or attenuate the inbound low IF signal or the inbound baseband signal to produce a filtered inbound signal.

The analog-to-digital converter 66 converts the filtered inbound signal from the analog domain to the digital domain to produce digital reception formatted data 90. The digital receiver processing module 64 decodes, descrambles, demaps, and/or demodulates the digital reception formatted data 90 to recapture inbound data 92 in accordance with the particular wireless communication standard being implemented by radio 60. The host interface 62 provides the recaptured inbound data 92 to the host device 18–32 via the radio interface 54.

As one of average skill in the art will appreciate, the wireless communication device of FIG. 2 may be implemented using one or more integrated circuits. For example, the host device may be implemented on one integrated circuit, the digital receiver processing module 64, the digital transmitter processing module 76 and memory 75 may be implemented on a second integrated circuit, and the remaining components of the radio 60, less the antenna 86, may be implemented on a third integrated circuit. As an alternate example, the radio 60 may be implemented on a single integrated circuit. As yet another example, the processing module 50 of the host device and the digital receiver and transmitter processing modules 64 and 76 may be a common processing device implemented on a single integrated circuit. Further, the memory 52 and memory 75 may be implemented on a single integrated circuit and/or on the same integrated circuit as the common processing modules of processing module 50 and the digital receiver and transmitter processing module 64 and 76.

FIG. 3 illustrates a schematic block diagram of a low noise amplifier 72 that includes a differential inductor 100, a differential inductor 102, and transistors T1–T4. Transistors T3 and T4 are operably coupled to differential inductor 102 that includes a $1^{st}$ winding L3 and a $2^{nd}$ winding L4. In addition, transistors T3 and T4 are operably coupled to receive a differential representation of the inbound RF signal 88.

Transistors T1 and T2 are operably coupled to the differential inductor 100 that includes a $1^{st}$ winding L1 and a $2^{nd}$ winding L2. The transistors are biased based on a bias voltage ($V_{bias}$) and produce a LNA differential output signal 106.

In operation, T3 receives a representation of the inbound RF signal 88 and T4 receives the same representation but 180° out of phase. As such, when T3 is being turned on, T4 is being turned off such that more current is flowing through T3 than through T4, which builds up a voltage across the inductors L1 and L3. Accordingly, the source of T1 is being pulled low while the source of T2 is going high since T4 is turning off. This creates the differential output 106. Conversely, when T4 is turning on and T3 is turning off, the current through T1 is decreasing while the current through T2 is increasing. This creates a lower voltage across L1 and a greater voltage across L2 producing the differential output 106. The construct of differential inductor 100 and differential inductor 102 may be constructed in accordance with the teachings of the present invention and will be described in greater detail with reference to FIGS. 7–10.

FIG. 4 illustrates a schematic block diagram of a mixer 110 that may be used in the down conversion module 70 or in the up conversion module 82. As shown, the mixer 110 includes differential inductors 116 and 118, input transistors T1 and T2, and switching transistors T3–T6. In operation, T1 and T2 are operably coupled to receive a mixer differential input 112, which may be the output of the low noise amplifier for the down conversion module or the filtered baseband signals from the up conversion module. The switching transistors are operably coupled to receive the transmitter local oscillation 83 or the receiver local oscillation 81. In this configuration, the mixer 110 mixes the mixer differential input 112 with the local oscillation 83 or 81 to produce the mixer differential output 114. The differential inductors 116 and 118 may be constructed in accordance with the teachings of the present invention and will be further described with reference to FIGS. 7–10.

FIG. 5 illustrates a schematic block diagram of a power amplifier 84 that includes a differential inductor 122, input transistors T3 and T4 and current control transistors T1 and T2. The input transistors T3 and T4 are operably coupled to receive a power amplifier differential input 120, which may be provided from the up conversion module 82. The input transistors T3 and T4 amplify the differential input 120 based on their respective gains and the load provided by the differential inductor 122. The power amplifier 84 produces a differential outbound RF signal 98. The differential inductor 122 may be constructed in accordance with the teachings of the present invention and will be further described with reference to FIGS. 7–10.

FIG. 6 illustrates a schematic block diagram of a bandpass filter 130 that includes series inductor capacitors L5, C5 and C6, a pair of differential inductors 136 and 138 and capacitors C1–C4. The differential inductors 136 and 138 each include a $1^{st}$ and $2^{nd}$ winding L1 and L2 and L3 and L4, respectively. The bandpass filter 130 is operably coupled to receive a differential filter input 132 and filter the signal to produce a differential filtered output 134.

The bandpass filter 130 may be used within the filtering/gain module 68 and/or the filtering/gain module 80. The differential inductors 136 and 138 may be constructed in accordance with the teachings of the present invention and will be further described with reference to FIGS. 7–10.

FIG. 7 illustrates a graphical representation of an on-chip differential inductor that may be used for the differential inductors 100, 102, 116, 118, 122, 136 and 138 illustrated in FIGS. 3–6. The differential inductor includes a $1^{st}$ interwound winding 140 and a $2^{nd}$ interwound winding 142. As shown, the windings 140 and 142 each include an octagonal shape and each have a $1^{st}$ node and a $2^{nd}$ node. The $2^{nd}$ nodes of the $1^{st}$ and $2^{nd}$ windings 140 and 142 are bridged together and coupled to a reference potential 146. The reference potential is an AC ground for the differential inductor.

Each of the interwound windings 140 and 142 include bridges 144 that are on a $2^{nd}$ layer of the integrated circuit and are used to couple the windings together. To reduce the series resistance of the differential inductor, the $1^{st}$ and $2^{nd}$ windings may be fabricated on the metalization layer of the integrated circuit having the lowest resistivity. Typically, this corresponds to the top layer. As one of average skill in the art will appreciate, the differential inductor may include one turn for each of the $1^{st}$ and $2^{nd}$ windings, multiple turns for each of the $1^{st}$ and $2^{nd}$ windings, or a combination thereof.

FIG. 8 illustrates a cross sectional view of a single layered differential inductor. In this illustration, the $1^{st}$ and $2^{nd}$ interwound windings 140 and 142 are fabricated from a metalization layer lying on dielectric layer 150. The dielectric layer may be comprised of silicon oxide, or other integrated circuit substance. The bridges 144 are fabricated on a metalization layer that lies on dielectric layer 152.

As shown, the $1^{st}$ interwound winding 140 and $2^{nd}$ interwound winding 142 are interwound with respect to each other. This provides the desired magnetic coupling while minimizing the capacitance. The number of windings, the width of the windings, and the shape of the windings, depend on the operating parameters under which the differential inductor will be required to perform. Typically, the desired operating rate for the inductor should be less than ½ the self-resonating frequency of the inductor. Based on these parameters, the acceptable capacitance may be derived as well as the desired inductance. The quality factor, which typically is more beneficial to the circuit the higher it is, is based on the resistivity of the windings. As such, the trace thickness for the windings are determined to provide the desired series resistance and are placed typically on the metal layer having the lowest resistivity. In this manner, the quality factor of the differential inductor may be optimized.

FIG. 9 illustrates a cross sectional view of a differential inductor that includes shunt windings 158 and 160. In this illustration, the $1^{st}$ and $2^{nd}$ interwound windings 140 and 142 are on dielectric layers 150. The corresponding bridges for the $1^{st}$ and $2^{nd}$ interwound windings 140 and 142 are on dielectric layer 152. Two additional dielectric layers 154 and 156 are used for this embodiment of the differential inductor. Dielectric layer 154 supports the metalization layer that is used to fabricate a $1^{st}$ shunt winding 158 that is coupled in parallel with the $1^{st}$ interwound winding 140. Similarly, the dielectric layer 154 supports the $2^{nd}$ shunt winding 160 that is coupled in parallel with the $2^{nd}$ interwound winding. Dielectric layer 156 supports the bridges 162 used to fabricate the $1^{st}$ and $2^{nd}$ shunt windings 158 and 160. By utilizing the shunt windings 158 and 160, the quality factor may be further enhanced since the series resistance of the $1^{st}$ and $2^{nd}$ windings 140 and 142 are reduced.

As one of average skill in the art will appreciate, additional shunt windings may be coupled in parallel with the $1^{st}$ and $2^{nd}$ windings 140 and 142 to further increase the quality factor by reducing the series resistance.

Figure 10:
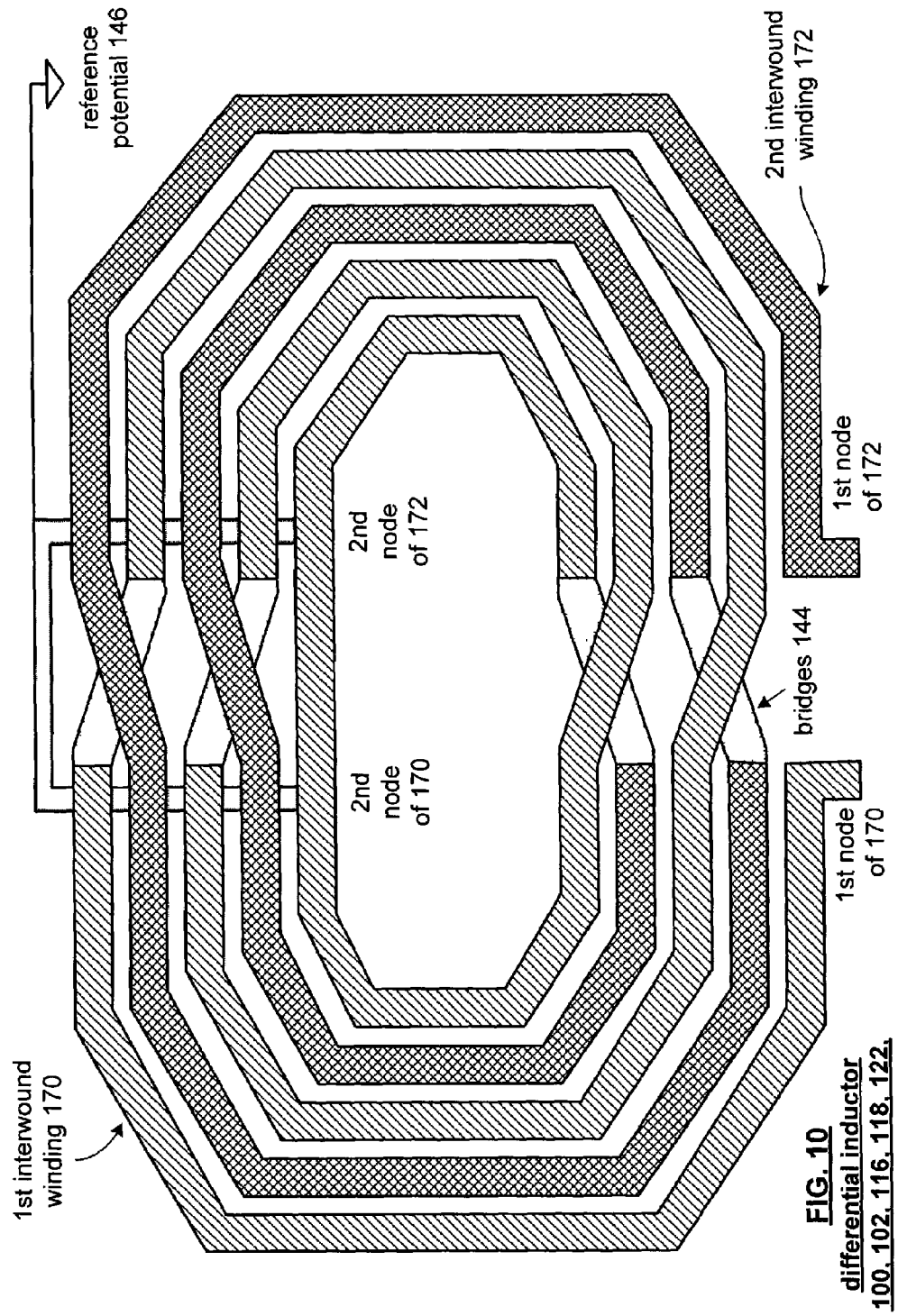
FIG. 10 is a graphical representation of an alternate differential inductor in accordance with the present invention.

FIG. 10 illustrates an alternate embodiment for a differential inductor that may be used in the circuits illustrated in FIGS. 3–6 or in other applications. The differential inductor includes a $1^{st}$ interwound winding 170 and a $2^{nd}$ interwound winding 172. Each of the windings 170 and 172 includes a $1^{st}$ node and a $2^{nd}$ node. The $2^{nd}$ nodes of winding 170 and 172 are operably coupled together and coupled to a reference potential 142. The $1^{st}$ nodes of winding 170 and 172 are operably coupled to receive a differential signal.

The $1^{st}$ and $2^{nd}$ windings 170 and 172 have a rectangular octagon geometric shape. The area of the rectangular differential inductor is similar to the area of the differential inductor illustrated in FIG. 7. By essentially flattening the differential inductor in one dimension or in the other, the differential inductor may be more readily placed in an integrated circuit layout. Further, the quality factor of the differential inductor of FIG. 10 may be improved by fabricating the $1^{st}$ and $2^{nd}$ windings on the metalization layer having the lowest resistivity. In addition, the $1^{st}$ and $2^{nd}$ windings 170 and 172 may include shunt windings as illustrated in FIG. 9.

The preceding discussion has presented various embodiments of an on-chip differential inductor and applications thereof. As one of average skill in the art will appreciate, other embodiments may be derived from the teaching of the present invention, without deviating from the scope of the claims.

What is claimed is:

1. An on-chip differential inductor comprises:
    first interwound winding on a layer of an integrated circuit, wherein the first interwound winding has a substantially octagon shape, wherein a first node of the first interwound winding is coupled to receive a first leg of a differential signal and a second node of the first interwound winding is coupled to a reference potential, and wherein the first interwound winding has a substantially octagonal shape; and
    second interwound winding on the layer of the integrated circuit, wherein the second interwound winding has a substantially octagon shape that is interwound with the first interwound winding, wherein a first node of the second interwound winding is coupled to receive a second leg of the differential signal and a second node of the second interwound winding is coupled to the reference potential, and wherein the first interwound winding is substantially symmetrical to the second interwound winding.

2. The on-chip differential inductor of claim 1, wherein the layer further comprises:
    metalization layer of the integrated circuit having lowest resistivity.

3. The on-chip differential inductor of claim 1, wherein the first interwound winding and the second interwound winding each further comprises multiple turns on the layer.

4. The on-chip differential inductor of claim 1, wherein the substantially octagonal shape of the first interwound winding further comprises:
    a rectangular octagonal shape having a first dimension lengthened with respect to a square octagonal reference shape and having a second dimension shortened with respect to the square octagonal reference shape, wherein area of the rectangular octagonal shape is similar to area of the square octagonal reference shape.

5. The on-chip differential inductor of claim 1, wherein the substantially octagonal shape of the second interwound winding further comprises:
    a rectangular octagonal shape having a first dimension lengthened with respect to a square octagonal reference shape and having a second dimension shortened with respect to the square octagonal reference shape, wherein area of the rectangular octagonal shape is similar to area of the square octagonal reference shape.

6. The on-chip differential inductor of claim 1 further comprises:
    first shunt winding on a second layer of the integrated circuit, wherein the first shunt winding is connected in parallel with the first interwound winding; and
    second shunt winding on the second layer, wherein the second shunt winding is connected in parallel with the second interwound winding.

7. The on-chip differential inductor of claim 1 further comprises:
    an integrated circuit size based on a balancing of an inductance value of the on-chip differential inductor, quality factor of the on-chip differential inductor, and capacitance of the on-chip differential inductor.

8. An on-chip differential inductor comprises:
    first interwound winding on a layer of an integrated circuit, wherein a first node of the first interwound winding is coupled to receive a first leg of a differential signal and a second node of the first interwound winding is coupled to a reference potential; and
    second interwound winding on the layer of the integrated circuit, wherein the second interwound winding is interwound with the first interwound winding, wherein a first node of the second interwound winding is coupled to receive a second leg of the differential signal and a second node of the second interwound winding is coupled to the reference potential, wherein the first interwound winding is substantially symmetrical to the second interwound winding, and wherein the layer is a metalization layer of the integrated circuit having lowest resistivity.

9. The on-chip differential inductor of claim 8, wherein the first and second interwound windings each further comprises a substantially octagonal shape.

10. The on-chip differential inductor of claim 9, wherein the substantially octagonal shape of the first interwound winding further comprises:
    a rectangular octagonal shape having a first dimension lengthened with respect to a square octagonal reference shape and having a second dimension shortened with respect to the square octagonal reference shape, wherein area of the rectangular octagonal shape is similar to area of the square octagonal reference shape.

11. The on-chip differential inductor of claim 9, wherein the substantially octagonal shape of the second interwound winding further comprises:
    a rectangular octagonal shape having a first dimension lengthened with respect to a square octagonal reference shape and having a second dimension shortened with respect to the square octagonal reference shape, wherein area of the rectangular octagonal shape is similar to area of the square octagonal reference shape.

12. The on-chip differential inductor of claim 8, wherein the first interwound winding and the second interwound winding each further comprises multiple turns on the layer.

13. The on-chip differential inductor of claim 8 further comprises:
    first shunt winding on a second layer of the integrated circuit, wherein the first shunt winding is connected in parallel with the first interwound winding; and
    second shunt winding on the second layer, wherein the second shunt winding is connected in parallel with the second interwound winding.

14. The on-chip differential inductor of claim 8 further comprises:
    an integrated circuit size based on a balancing of an inductance value of the on-chip differential inductor, quality factor of the on-chip differential inductor, and capacitance of the on-chip differential inductor.

15. An on-chip differential inductor comprises:
    first interwound winding on a layer of an integrated circuit, wherein a first node of the first interwound winding is coupled to receive a first leg of a differential signal and a second node of the first interwound winding is coupled to a reference potential; and second interwound winding on the layer of the integrated circuit, wherein the second interwound winding is interwound with the first interwound winding, wherein a first node of the second interwound winding is coupled to receive a second leg of the differential signal and a second node of the second interwound winding is coupled to the reference potential, wherein the first interwound winding is substantially symmetrical to the second interwound winding, and wherein each of the first and second interwound windings includes a rectangular octagonal shape having a first dimension lengthened with respect to a square octagonal reference shape and having a second dimension shortened with respect to the square octagonal reference shape, wherein area of the rectangular octagonal shape is similar to area of the square octagonal reference shape.

16. The on-chip differential inductor of claim 15, wherein the layer further comprises a metalization layer of the integrated circuit having lowest resistivity.

17. The on-chip differential inductor of claim 15, wherein the first interwound winding and the second interwound winding each further comprises multiple turns on the layer.

18. The on-chip differential inductor of claim 15 further comprises:

first shunt winding on a second layer of the integrated circuit, wherein the first shunt winding is connected in parallel with the first interwound winding; and second shunt winding on the second layer, wherein the second shunt winding is connected in parallel with the second interwound winding.

19. The on-chip differential inductor of claim 15 further comprises:

an integrated circuit size based on a balancing of an inductance value of the on-chip differential inductor, quality factor of the on-chip differential inductor, and capacitance of the on-chip differential inductor.

20. The on-chip differential inductor of claim 15 further comprises:

first shunt winding on a second layer of the integrated circuit, wherein the first shunt winding is connected in parallel with the first interwound winding; and second shunt winding on the second layer, wherein the second shunt winding is connected in parallel with the second interwound winding.

21. An integrated circuit radio comprises:

low noise amplifier operably to amplify an inbound radio frequency (RF) signal to produce an amplified RF signal;

down conversion mixer module operably coupled to mix the amplified RF signal with a local oscillation to produce a low intermediate frequency (IF) signal;

filter operably coupled to filter the low IF signal to produce a filtered inbound signal;

receiver processing module operably coupled to recapture inbound data from the filtered inbound signal in accordance with a data encoding/decoding protocol;

transmitter processing module operably coupled to produce a baseband signal from outbound data in accordance with the data encoding/decoding protocol;

up conversion mixing module operably coupled to mix the baseband signal with the local oscillation to produce an outbound RF signal;

power amplifier operably coupled to amplify the outbound RF signal prior to transmission via an antenna; and local oscillation module operable to produce the local oscillation, wherein at least one of the low noise amplifier, a mixer of the down conversion mixing module, the filter, a mixer of the up conversion mixing module, the local oscillation module, and the power amplifier includes a differential inductor that includes:

first interwound winding on a layer of the integrated circuit radio, wherein a first node of the first interwound winding is coupled to receive a first leg of a differential signal and a second node of the first interwound winding is coupled to a reference potential, and wherein the first interwound winding has a substantially octagonal shape; and second interwound winding on the layer of the integrated circuit radio, wherein the second interwound winding has a substantially octagon shape that is interwound with the first interwound winding, wherein a first node of the second interwound winding is coupled to receive a second leg of the differential signal and a second node of the second interwound winding is coupled to the reference potential, and wherein the first interwound winding is substantially symmetrical to the second interwound winding.

22. The integrated circuit radio of claim 21, wherein the layer further comprises:

metalization layer of the integrated circuit having lowest resistivity.

23. The integrated circuit radio of claim 21, wherein the first interwound winding and the second interwound winding each further comprises multiple turns on the layer.

24. The integrated circuit radio of claim 21, wherein the substantially octagonal shape of the first interwound winding further comprises:

a rectangular octagonal shape having a first dimension lengthened with respect to a square octagonal reference shape and having a second dimension shortened with respect to the square octagonal reference shape, wherein area of the rectangular octagonal shape is similar to area of the square octagonal reference shape.

25. The integrated circuit radio of claim 21, wherein the substantially octagonal shape of the second interwound winding further comprises:

a rectangular octagonal shape having a first dimension lengthened with respect to a square octagonal reference shape and having a second dimension shortened with respect to the square octagonal reference shape, wherein area of the rectangular octagonal shape is similar to area of the square octagonal reference shape.

26. The integrated circuit radio of claim 21, wherein the differential inductor further comprises:

first shunt winding on a second layer of the integrated circuit, wherein the first shunt winding is connected in parallel with the first interwound winding; and second shunt winding on the second layer, wherein the second shunt winding is connected in parallel with the second interwound winding.

27. The radio of claim 21, wherein the differential inductor further comprises:

an integrated circuit size based on a balancing of an inductance value of the on-chip differential inductor, quality factor of the on-chip differential inductor, and capacitance of the on-chip differential inductor.

28. An integrated circuit radio comprises:
low noise amplifier operably to amplify an inbound radio frequency (RF) signal to produce an amplified RF signal;
down conversion mixer module operably coupled to mix the amplified RF signal with a local oscillation to produce a low intermediate frequency (IF) signal;
filter operably coupled to filter the low IF signal to produce a filtered inbound signal;
receiver processing module operably coupled to recapture inbound data from the filtered inbound signal in accordance with a data encoding/decoding protocol;
transmitter processing module operably coupled to produce a baseband signal from outbound data in accordance with the data encoding/decoding protocol;
up conversion mixing module operably coupled to mix the baseband signal with the local oscillation to produce an outbound RF signal;
power amplifier operably coupled to amplify the outbound RF signal prior to transmission via an antenna; and
local oscillation module operable to produce the local oscillation, wherein at least one of the low noise amplifier, a mixer of the down conversion mixing module, the filter, a mixer of the up conversion mixing module, the local oscillation module, and the power amplifier includes a differential inductor that includes:
first interwound winding on a layer of the integrated circuit radio, wherein a first node of the first interwound winding is coupled to receive a first leg of a differential signal and a second node of the first interwound winding is coupled to a reference potential; and
second interwound winding on the layer of the integrated circuit radio, wherein the second interwound winding is interwound with the first interwound winding, wherein a first node of the second interwound winding is coupled to receive a second leg of the differential signal and a second node of the second interwound winding is coupled to the reference potential, wherein the first interwound winding is substantially symmetrical to the second interwound winding, and wherein the layer is a metalization layer of the integrated circuit having lowest resistivity.

29. The integrated circuit radio of claim 28, wherein the first interwound winding and the second interwound winding each further comprises multiple turns on the layer.

30. The integrated circuit radio of claim 28, wherein the differential inductor further comprises:
first shunt winding on a second layer of the integrated circuit, wherein the first shunt winding is connected in parallel with the first interwound winding; and
second shunt winding on the second layer, wherein the second shunt winding is connected in parallel with the second interwound winding.

31. The integrated circuit radio of claim 28, wherein the differential inductor further comprises:
an integrated circuit size based on a balancing of an inductance value of the on-chip differential inductor, quality factor of the on-chip differential inductor, and capacitance of the on-chip differential inductor.

32. The integrated circuit radio of claim 28, wherein the first and second interwound windings each further comprises a substantially octagonal shape.

33. The integrated circuit radio of claim 32, wherein the substantially octagonal shape of the first interwound winding further comprises:
a rectangular octagonal shape having a first dimension lengthened with respect to a square octagonal reference shape and having a second dimension shortened with respect to the square octagonal reference shape, wherein area of the rectangular octagonal shape is similar to area of the square octagonal reference shape.

34. The integrated circuit radio of claim 32, wherein the substantially octagonal shape of the second interwound winding further comprises:
a rectangular octagonal shape having a first dimension lengthened with respect to a square octagonal reference shape and having a second dimension shortened with respect to the square octagonal reference shape, wherein area of the rectangular octagonal shape is similar to area of the square octagonal reference shape.

35. An integrated circuit radio comprises:
low noise amplifier operably to amplify an inbound radio frequency (RF) signal to produce an amplified RF signal;
down conversion mixer module operably coupled to mix the amplified RF signal with a local oscillation to produce a low intermediate frequency (IF) signal;
filter operably coupled to filter the low IF signal to produce a filtered inbound signal;
receiver processing module operably coupled to recapture inbound data from the filtered inbound signal in accordance with a data encoding/decoding protocol;
transmitter processing module operably coupled to produce a baseband signal from outbound data in accordance with the data encoding/decoding protocol;
up conversion mixing module operably coupled to mix the baseband signal with the local oscillation to produce an outbound RF signal;
power amplifier operably coupled to amplify the outbound RF signal prior to transmission via an antenna; and
local oscillation module operable to produce the local oscillation, wherein at least one of the low noise amplifier, a mixer of the down conversion mixing module, the filter, a mixer of the up conversion mixing module, the local oscillation module, and the power amplifier includes a differential inductor that includes:
first interwound winding on a layer of the integrated circuit radio, wherein a first node of the first interwound winding is coupled to receive a first leg of a differential signal and a second node of the first interwound winding is coupled to a reference potential; and
second interwound winding on the layer of the integrated circuit radio, wherein the second interwound winding is interwound with the first interwound winding, wherein a first node of the second interwound winding is coupled to receive a second leg of the differential signal and a second node of the second interwound winding is coupled to the reference potential, wherein the first interwound winding is substantially symmetrical to the second interwound winding, and wherein each of the first and second interwound windings includes a rectangular octagonal shape having a first dimension lengthened with respect to a square octagonal reference shape and having a second dimension shortened with respect to the square octagonal reference shape, wherein area of the rectangular octagonal shape is similar to area of the square octagonal reference shape.

36. The integrated circuit radio of claim 35, wherein the layer further comprises a metalization layer of the integrated circuit having lowest resistivity.

37. The integrated circuit radio of claim 35, wherein the first interwound winding and the second interwound winding each further comprises multiple turns on the layer.

38. The integrated circuit radio of claim 35, wherein the differential inductor further comprises:

an integrated circuit size based on a balancing of an inductance value of the on-chip differential inductor, quality factor of the on-chip differential inductor, and capacitance of the on-chip differential inductor.

* * * * *